US006306963B1

(12) United States Patent
Lane et al.

(10) Patent No.: US 6,306,963 B1
(45) Date of Patent: Oct. 23, 2001

(54) THERMOSETTING RESINS AND LAMINATES

(75) Inventors: Scott A. Lane, Eads; Timothy W. Austill, Memphis; Donald C. Rollen, Collierville, all of TN (US); Herbert Shin-I Chao, Paoli, PA (US); Kenneth P. Zarnoch, Scotia, NY (US); Hua Guo, Selkirk, NY (US); David Parrillo, Schenectady, NY (US); David Peter Reis, Lenox, MA (US); Narsi Devanathan, Slingerlands, NY (US); Benny David, Great Barrington, MA (US)

(73) Assignees: General Electric Co., Pittsfield, MA (US); GIL Technology, Collierville, TN (US)

( * ) Notice: Subject to any disclaimer, the term of this patent is extended or adjusted under 35 U.S.C. 154(b) by 0 days.

(21) Appl. No.: 09/657,648

(22) Filed: Sep. 7, 2000

Related U.S. Application Data

(60) Provisional application No. 60/202,812, filed on May 8, 2000.

(51) Int. Cl.$^7$ .................................................. C08G 63/91
(52) U.S. Cl. .............................. 525/68; 525/69; 525/242; 525/333.7
(58) Field of Search ................................ 525/68, 69, 242, 525/333.7

(56) References Cited

U.S. PATENT DOCUMENTS

| 4,587,161 | 5/1986 | Barrell et al. . |
| 4,803,022 | 2/1989 | Barrell et al. . |
| 5,213,886 | 5/1993 | Chao et al. . |
| 5,223,568 | 6/1993 | Landi et al. . |
| 5,352,745 | 10/1994 | Katayose et al. . |
| 5,571,609 | 11/1996 | St. Lawrence et al. . |
| 5,834,565 | 11/1998 | Tracy et al. . |

FOREIGN PATENT DOCUMENTS

10060138 * 3/1998 (JP) .

OTHER PUBLICATIONS

Koseki, Caplus AN 1998:143481.*

* cited by examiner

Primary Examiner—Jeffrey Mullis

(57) ABSTRACT

Thermosetting polymers and the electrical laminates made therefrom are disclosed. The laminate comprises a crosslinked product of: a) one or more ethylenically unsaturated aromatic monomers, with fire retardation being optionally contributed by one halogenated monomer, b) a vinyl-terminated polybutadiene or butadiene-styrene copolymer containing either a urethane or an ester group, and c) a chemically modified polyphenylene ether resin, preferably low molecular weight chemically modified polyphenylene ether resin. It has been discovered that an unexpected combination of thermal, electrical, and mechanical properties are obtained from the composition recited herein. Therefore, the composition is ideally suited as a matrix polymer for electrical substrate applications.

51 Claims, No Drawings

THERMOSETTING RESINS AND LAMINATES

CROSS-REFERENCE TO RELATED APPLICATIONS

This application claims the benefit of U.S. Provisional Application No. 60/202,812, filed May 8, 2000, which is incorporated herein by reference.

FEDERALLY SPONSORED RESEARCH

Not Applicable

BACKGROUND OF THE INVENTION

The invention disclosed herein describes thermosetting resin compositions useful as a matrix resin for electrical substrate applications. The thermosetting polymers are characterized by exceptional adhesion to copper foil combined with excellent thermal and electrical performance. This combination of properties is not achievable with compositions of the prior art.

The thermosetting resin compositions disclosed in U.S. Pat. No. 5,223,568 of Landi et al. comprise a polybutadiene or polyisoprene resin which is a liquid at room temperature and has a molecular weight less than 5,000 combined with a solid butadiene or isoprene containing polymer capable of cross-linking with the former polybutadiene or polyisoprene resin. Such compositions are described as generally useful for making electrical substrate materials; however, cure temperatures in excess of 250° C. are employed. These cure temperatures exceed the limitations of most commercially available and cost-effective equipment.

U.S. Pat. No. 5,571,609 of St. Lawrence et al. describes an electrical substrate material similar to Landi et al. but with incorporation of woven glass fabric and particulate filler. The electrical substrates formed from these compositions afford copper foil adhesions (peel bonds) that range from 2.1 to 5 pounds per inch width via test method IPC-TM-650 2.4.8 on one ounce per square foot copper foil. Peel bonds in this range are marginal for many electrical substrate applications. Low peel bonds can render subsequently fabricated electrical circuits with poor reliability and cause failures during high temperature soldering and reflow soldering operations.

A need continues to exist for a thermosetting resin composition useful as a matrix resin for an electrical substrate capable of being manufactured on commercially available high-speed processing equipment such as described in U.S. Pat. Nos. 4,587,161 and 4,803,022 of Barrell et. al., preferably at cure temperatures of less than about 250° C., more preferably less than about 180° C. It is especially desirable to have electrical substrates made from compositions having high glass transition temperatures, e.g., greater than about 150° C., and having high levels of adhesion (e.g., peel bonds over about 7 pounds per inch width for one ounce per square foot copper foil) to metal foil, preferable copper foil. Additionally, a need exists for compositions having Theological properties suitable for continuous lamination without the addition of solvents. Compositions that require solvents for lamination can have deficiencies associated with the incomplete removal of the solvent during the impregnation process. Additionally, the environmental emission and personal exposure of some of the most commonly used solvents can be of considerable concern.

A need continues to exist for thermosetting resin compositions with excellent electrical properties suitable for use in high frequency applications. For a polymer dielectric to be suitable for use at broadband high frequencies, it is highly desired for the dielectric constant to be stable over decades of frequency and over the environmental extremes of humidity and temperature.

SUMMARY OF THE INVENTION

The needs discussed above have been generally satisfied by the discovery of a composition comprising:

(a) about 1 to 99%, preferably at least about 50% by weight of one or more ethylenically unsaturated aromatic monomers (EUAM) having the formula:

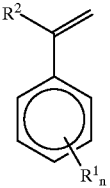

wherein $R^1$ represents a hydrogen, an alkene group, or alkyl group and n=1, or wherein $R^1$ represents halogen atoms and n=1 to 3, and $R^2$ represents a hydrogen atom or an alkyl group, (b) about 1 to 99%, preferably from about 1% to about 50% by weight of a vinyl-terminated polymer (VTP) having the formula:

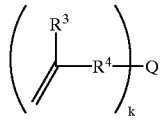

wherein $R^3$ represents $CH_3$ or H, $R^4$ is an urethane or ester residue, Q represents a polybutadiene homopolymer or a butadiene-styrene copolymer, and k is on average less than 3, and (c) about 1 to 99%, preferably from about 1% to about 50% by weight of a chemically modified polyphenylene ether resin (CMPPE) having aliphatic unsaturation moieties, i.e. aliphatic carbon-carbon double bonds, and having an intrinsic viscosity less than about 0.6 dl/g, preferably less than about 0.30 dl/g, more preferably between about 0.07 and 0.15 dl/g, as measured in chloroform at 30° C.; wherein all weight percentages are based on the combined weights of components (a), (b), and (c).

Such compositions optionally also may contain a polymerization catalyst and/or initiator, a flame-retardant compound, and/or one or more fillers, reinforcing agents, or fillers and reinforcing agents.

A further embodiment of this invention particularly useful for printed circuit boards is a thermoset composition comprising reaction products of the aforementioned composition that may further include other additives such as, for example, a fibrous reinforcement.

Compositions described herein may be used to impregnate fibrous reinforcement clad with copper to form an electrical circuit board offering excellent dielectric and thermal properties, and accelerated rates of polymerization in formation of the compositions. Moreover, such compositions can be made flame-retardant. The thermosets made using the compositions and electrical composite substrates as described herein can exhibit dielectric constants as low as 2.7 and the dissipation factors as low as 0.002 at 10 GHz. In a preferred embodiment, composites made the composition exhibit consistency of electrical properties over temperature and frequency. For example, dielectric constants can be obtained that vary only 15 parts-per-million per degree Celsius and by 0.05 from 1 MHz to 10 GHz. In a preferred embodiment, the electrical properties generally do not vary significantly in humid environments since the typical moisture absorption of the invented composition is less than 0.05% by weight, measured as the weight gain after 24 hours at room temperature in water.

The description that follows provides further details regarding this invention.

DESCRIPTION OF THE DRAWINGS

Not applicable.

DETAILED DESCRIPTION OF THE INVENTION

The ethylenically unsaturated aromatic monomer (EUAM) at high weight percentages (e.g., greater than about 50% by weight) affords a thermosetting resin composition with favorable electrical properties. As the level of EUAM is increased, the dielectric constant and dissipation factor is reduced. High speed digital applications for copper-clad circuit boards favor lower dielectric constant, while high frequency wireless communication applications for copper-clad circuit boards favor both lower dielectric constant and lower dissipation factor. It has been unexpectedly found that as the level of halogenated styrene monomer increases in total percentage of the EUAM component, the glass transition temperature of the cured resin increases and the composition is rendered fire resistant. For example, if the EUAM component is changed from substantially styrene to substantially dibromostyrene, the glass transition temperature of the resin will increase from about 100° C. to about 180° C. Higher glass transition temperatures are generally favored for copper-clad circuit board applications.

Thermosetting resins based upon substantially 100% of the EUAM component do not afford favorable compositions for copper-clad circuit board applications. While the electrical properties of such a composition may be acceptable, the mechanical properties, especially adhesion to copper foil, are extremely deficient. For example, a thermosetting composition comprising substantially 100% dibromostyrene will have a favorable dielectric constant of about 2.4 and dissipation factor of about 0.002. However, the adhesion to copper foil to this resin composition will be less than 2 pounds per inch width for 1 ounce per square foot copper foil and the mechanical properties will be sufficiently low to cause substantial cracking problems during fabrication presumably due to the brittleness of the resin. Incorporation of about 10% of a urethane containing polybutadiene resin into dibromostyrene unexpectedly increased the adhesion to copper foil to over 10 pounds per inch width of 1 ounce per square foot copper foil with a negligible impact to electrical properties. Additionally, incorporation of CMPPE resin unexpectedly maintained the favorable copper adhesion while improving the electrical properties. Thus, in one embodiment of the present invention an improved thermoset has been developed comprising reaction products between EUAM, VTP, and/or CMPPE. Such thermosets can be used in circuit board applications.

Likewise, thermosetting resins based upon substantially 100% of the VTP component do not generally make compositions favorable for copper-clad circuit board applications. These cured resins typically suffer from very low glass transition temperatures and unfavorable electrical properties. Additionally, thermosetting resins based upon substantially 100% of the CMPPE do not make compositions favorable for copper-clad circuit board applications.

It is an important feature of this invention that the vinyl-terminated polymer contains at least one of urethane or ester groups. Vinyl functional polybutadiene resins that do not contain these important residues do not provide the desirable adhesion to copper foil. For example, 10% by weight of a pendant vinyl-functional polybutadiene resin (e.g., Ricon 152 available from Ricon Resins, Inc.) in 90% by weight of dibromostyrene resulted in a cured composition with adhesion to copper of only 2.3 lbs per inch width (on one ounce copper foil). A comparable cured composition made with a vinyl-terminated polybutadiene containing a urethane group unexpectedly yielded over 10 lbs per inch width adhesion to one ounce per square foot copper foil. Thus, in one embodiment of the present invention a method for enhancing the adhesion to metal foils, preferably copper foil, has been developed.

An example of a urethane containing vinyl-terminated polybutadiene resin would be the reaction product of a polybutadiene polyol with a vinyl-terminated isocyanate:

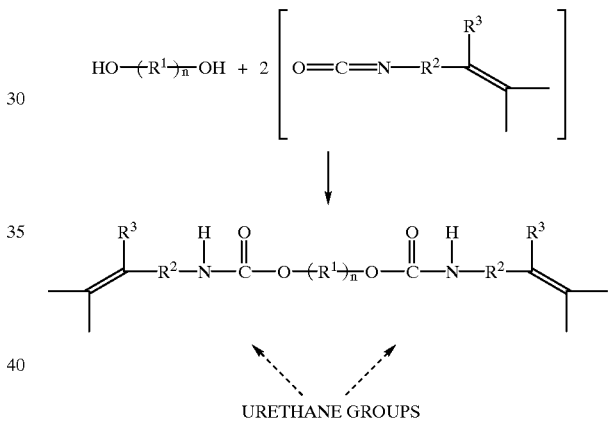

wherein $R^1$ is a multiple of one of the following structures or a mixture containing at least one of the following structures:

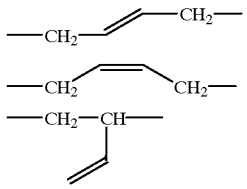

and wherein $R^2$ represents the residue from the specific vinyl terminated isocyanate, and $R^3$ represents a hydrogen or alkyl group, and n is on average between about 5 to 150, preferably between about 25 and 75. The $R^1$ substituents may be any combination of one or more residues from the polymerization of butadiene. The aforementioned reaction proceeds through well-known chemistry utilizing catalysis and temperatures known to those skilled in the art. Specific examples of suitable polybutadiene polyols include the commercial products Poly bd® resins from Elf Atochem North America, Inc. A specific example of a suitable vinyl terminated isocyanate is a product from Cytec Industries, Inc., TMI® meta-unsaturated aliphatic isocyanate. An especially preferred urethane containing vinyl-terminated polybutadiene resin has the formula:

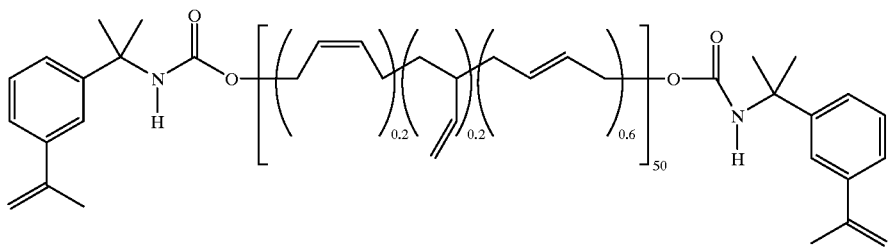

This material is commercially available from Elf Atochem North America as Poly bd® R45VT.

Alternately, a urethane containing vinyl-terminated polybutadiene resin may be formed from the reaction product of a polybutadiene diisocyanate resin with a vinyl-terminated alcohol:

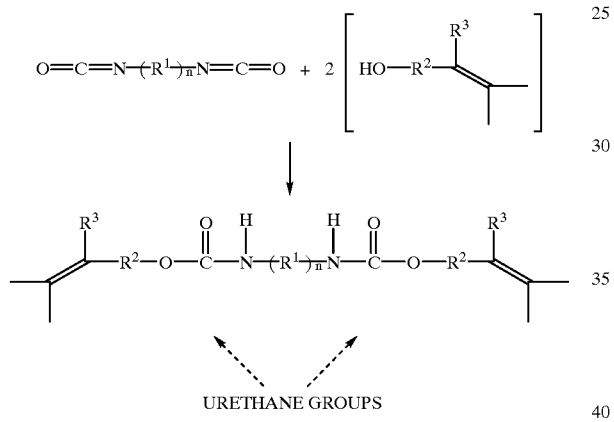

wherein $R^1$ is a multiple of one of the following structures or a mixture containing at least one of the following structures:

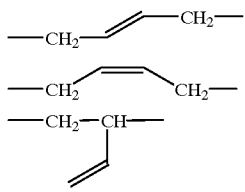

(i.e. $R^1$ represents the residues from the polymerization of butadiene), $R^3$ represents a hydrogen or alkyl group, and $R^2$ represents the residue from the specific vinyl-terminated alcohol, and n is on average between about 5 to 150, preferably between about 25 and 75. The aforementioned reaction proceeds through well-known chemistry utilizing catalysis and temperatures known to those skilled in the art.

An example of a urethane containing vinyl terminated butadiene-styrene copolymer would be the reaction product via one of the reaction pathways described, with the exception that $R^1$ is a multiple of one of the following repeating structures or a mixture containing at least one of the following repeating structures:

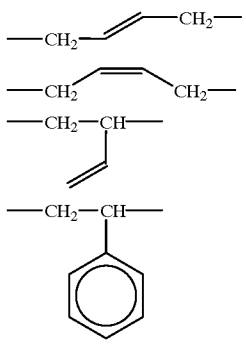

wherein the $R^1$ substituents may be one or more residues from the polymerization of butadiene and styrene.

An example of an ester containing vinyl-terminated polybutadiene resin would be the reaction product of a vinyl-terminated epoxide with a carboxyl-terminated polybutadiene resin:

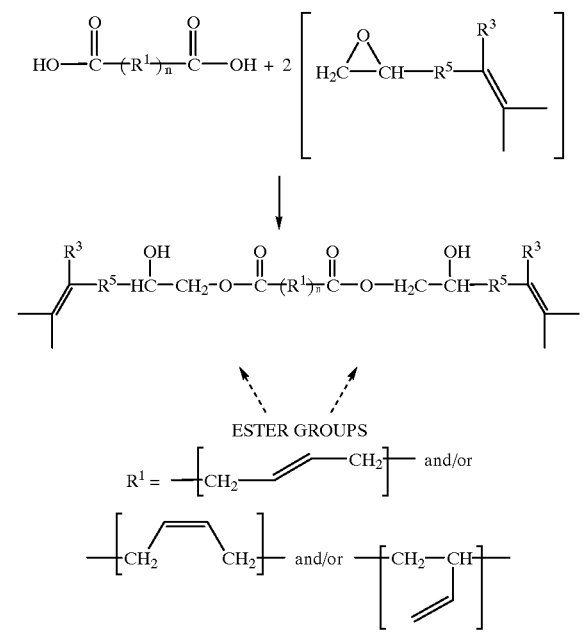

wherein $R^1$ is a multiple of one of the following repeating structures or a mixture containing at least one of the following repeating structures:

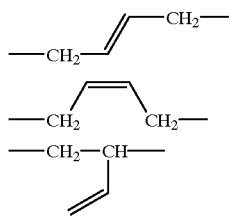

(i.e. $R^1$ represents the residues from the polymerization of butadiene), $R^3$ represents a hydrogen or alkyl group, and $R^5$ represents the residue from the specific vinyl-terminated epoxide, and n is on average between about 5 to 150, preferably between about 25 and 75. An example of the carboxyl-terminated polybutadiene resin would be Hycar® from BFGoodrich Company. A suitable example of a vinyl-terminated epoxide would be glycidyl methacrylate.

Alternately, an ester containing vinyl-terminated polybutadiene resin could be prepared from the reaction product of an epoxy-terminated polybutadiene resin with a vinyl-terminated carboxylic acid:

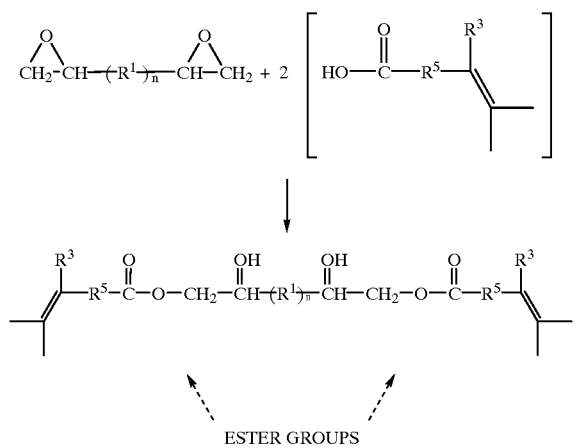

$R^3$ represents a hydrogen or alkyl group, and $R^5$ represents an alkylidene residue or a carbon bond, i.e. a vinyl residue directed linked to the carboxyl group.

An example of a suitable epoxy-terminated polybutadiene resin would be a Hycar® resin from BFGoodrich Company. An example of a suitable vinyl-terminated carboxylic acid would be methacrylic acid or acrylic acid. BFGoodrich Company also manufactures an ester containing vinyl-terminated polybutadiene resin available as Hycar® 2000X168 resin.

An example of an ester containing vinyl terminated butadiene-styrene copolymer is the reaction product via one of the reaction pathways described above, with the exception that $R^1$ is a multiple of one of the following repeating structures or a mixture containing at least one of the following repeating structures:

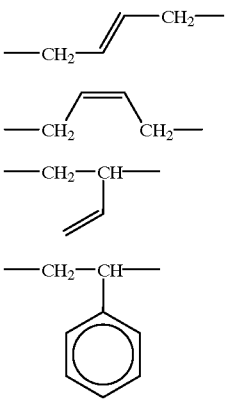

wherein the $R^1$ substituents may be one or more residues from the polymerization of butadiene and styrene, and n is on average between about 5 to 150, preferably between about 25 and 75.

Condensation esterification can be employed to prepare ester containing polybutadiene resins and butadiene-styrene copolymers from the esterification of hydroxyl functional polybutadiene resins or butadiene-styrene copolymers with a vinyl-terminated carboxylic acid. Suitable examples of the polybutadiene polyol include the PolyBd® resins from Elf Atochem North America Inc., and the vinyl-terminated carboxylic acid includes methacrylic acid or acrylic acid and the like.

As especially preferred VTP containing polyester residues has the formula:

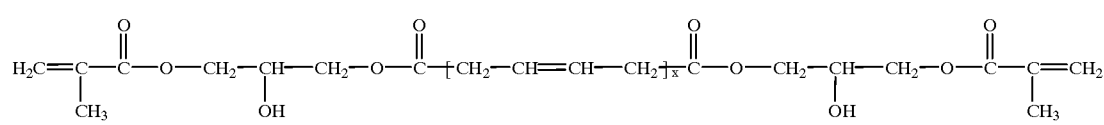

wherein x is from about 50 to 250. A useful VTP of this type is commercially available under the trademark Hycar 2000X166 polymer from BF Goodrich Company, Chemicals Group.

Useful CMPPE include compounds derived by reacting any of the known PPE compounds containing phenolic hydroxyl residues at a concentration of greater than about 5 ppm with a reactive capping agent. Such uncapped PPE compounds are described in a variety of patents and publications such as, for example, in U.S. Pat. Nos. 5,352,745, 5213,886, and 5,834,565, the disclosures of which are expressly incorporated herein by reference.

The preferred reactively capped PPE compounds include those containing recurring units of structure:

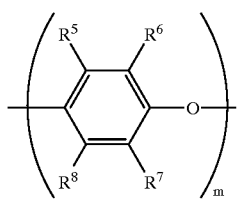

wherein $R^{5-8}$ may be independently hydrogen, alkyl, alkenyl, aryl, mixed alkyl-aryl hydrocarbons, or such groups also containing a substituent selected from the group consisting of carboxylic acid, aldehyde, alcohol, and amino functionality (e.g., amide or imide group), and m ranges from 1–200.

Most preferable poly(phenylene ether) compounds are of general structure:

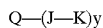

wherein Q is the residuum of a phenol, including polyfunctional phenols, and includes radicals of the following structure:

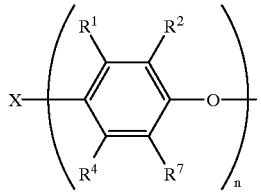

wherein X is hydrogen, $C_{1-100}$ alkyl, aryl, and mixed alkyl-aryl hydrocarbons, or such hydrocarbon groups containing a substituent selected from the group consisting of carboxylic acid, aldehyde, alcohol, and amino radicals. X also may be sulfur, sulfonyl, sulfuryl, oxygen, or other such bridging group having a valency of 2 to result in various bis- or higher polyphenols. $R^{1-4}$ independently may be hydrogen, $C_{1-100}$ alkyl, aryl, mixed alkyl-aryl hydrocarbons, and the like; y and n independently range from about 1–100, preferably about 1–3, and most preferably about 1–2; and in one embodiment, y and n are the same; and J comprises recurring units of the following structure:

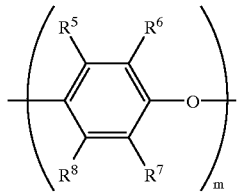

wherein $R^{5-8}$ independently may be hydrogen, alkyl, alkenyl, alkynoyl, aryl, mixed alkyl-aryl hydrocarbons, or such groups also containing a substituent selected from the group consisting of carboxylic acid, aldehyde, alcohol, and amino functionality (e.g., amide or imide group), and m ranges from 1–200, and K has the following structure:

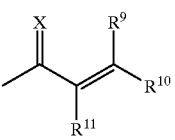

wherein X is O, S, or two hydrogens, preferably S or O, and wherein $R^{9-11}$ are independently a hydrogen or $C_{1-100}$ alkyl or aryl or mixed alkyl or aryl group. Preferably, $R^{9-10}$ are hydrogen and $R^1$ is a methyl.

It is an important feature that the polyphenylene ether resin be chemically modified so to contain a reactive moiety, preferably a carbon-carbon double bond. In the absence of such a reactive moiety, e.g., where the chemical modified PPE contains a residual isobutryate group:

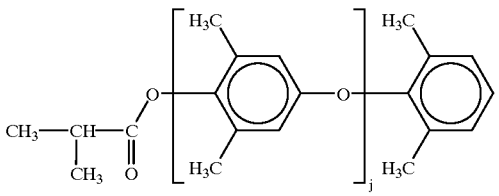

the composition is substantially plasticized, as evident by a reduction in the glass transition temperature, reducing the flexural modulus above the glass transition temperature, and reducing the adhesion to copper foil.

CMPPE include those having an intrinsic viscosity (I.V.) of less than about 0.6 dl/g as measured in chloroform at 30° C. It is highly desirable to provide a thermosetting resin composition that does not require viscosity reduction via solvent incorporation to render it suitable for impregnation. Therefore, in preferred embodiments the I.V. of the CMPPE is within a range that the viscosity of the thermosetting composition closely approximates the viscosity of the same composition not containing the CMPPE. Accordingly, in preferred embodiments the I.V. of the CMPPE is preferably less than about 0.30 dl/g, more preferably less than about 0.15 dl/g and most preferably between about 0.08 and 0.14 dl/g as measured in chloroform at 30° C. Such preferred CMPPE generally have a number average molecular weight ranging from between about 250 to 10,000 g/mol, preferably less than about 3800 g/mol, relative to polystyrene standards.

Desirably, the PPE contains low levels of amine containing end groups derived from well-known catalyst side reactions. It is preferable to remove such amine containing end groups prior to reactively capping the PPE. Such materials may be prepared by processing the uncapped PPE at temperatures about 150° C. to about 350° C. followed by capping. Prior to capping, the polyphenylene ethers preferred herein may be prepared from PPE typically having a number average molecular weights in the range of about 15,000–25,000.

Preparation of a low molecular PPE composition can be accomplished by reacting the PPE with an oxidizing agent such as, for example, a peroxide or a quinone with or without a phenol (including bisphenols). Another procedure is to obtain a low molecular weight PPE by oxidative coupling as described above to produce resins of less than 3,000 number average molecular weight which are isolated, preferably, by a direct isolation method. Direct isolation is a process in which the PPE resin is isolated from the solvent used in polymerization by heating under reduced pressure. However, even such low molecular weight resins can optionally be functionalized with a peroxide or a peroxide and a phenol to achieve even lower molecular weight resins.

A capping catalyst, is often employed in the generation of the reactively capped PPE. Examples of such compounds include those known to to the art that are capable of catalyzing condensation of phenols with the capping agents described below. Useful materials are basic compounds including, for example, basic compound hydroxide salts such as sodium, potassium, or tetraalkylammonium hydroxides; or tertiary alkyl amines such as tributyl amine, triethylamine, dimethylbenzylamine, dimethylbutylamine and the like; tertiary mixed alkyl-arylamines and substituted derivatives thereof such as dimethylaniline; heterocyclic amines such as imidazoles or pyridines and substituted derivatives thereof such as 2-methylimidazole, 2-vinylimidazole, 4-(dimethylamino)pyridine, 2-, 3-, or 4-vinylpyridine. Also useful are organometallic salts such as, for example, tin and zinc salts known to catalyze the condensation of, for example, isocyanates or cyanate esters with phenols. The organometallic salts useful in this regard are known to the art in numerous publications and patents well known to those skilled in this art.

Capping agents include compounds known in the literature to react with phenolic groups, and which contain carbon-carbon unsaturation for curing into the thermoset matrix via polymerization of its unsaturation following the capping reaction. Such compounds include both monomers and polymers containing, for example, anhydride, acid chloride, epoxy, carbonate, ester, isocyanate, cyanate ester, or alkyl halide radicals. Capping agents are not limited to organic compounds as, for example, phosphorus and sulfur based capping agents also are included. Examples of such compounds include, for example, acrylic anhydride, methacrylic anhydride, glycidylacrylate or glycidylmethacrylate, acetyl chloride, benzoyl chloride, diphenyl such as di(4-nitrophenyl)carbonate, acryloyl, methacryloyl or acetyl esters, phenylisocyanate, 3-isopropenyl-α,α-dimethylphenylisocyanate, cyanatobenzene, 2,2-bis(4-cyanatophenyl)propane), 3- or 4-(α-chloromethyl)styrene, allyl bromide, and the like, carbonate and substituted derivatives thereof and mixtures thereof.

In one embodiment, preferred capped poly(phenylene ether)s of the present invention include those of the general structure:

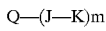
Q—(J—K)m wherein Q is the residuum of a phenol;

J comprises recurring units of the following structure:

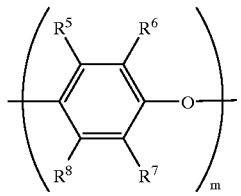

wherein R5-8 independently is selected from hydrogen, alkyl, alkenyl, alkynoyl, aryl, mixed alkyl-aryl hydrocarbons, wherein such groups may contain a substituent selected from carboxylic acid, aldehyde, alcohol, and amino functionality;

K has the following structure:

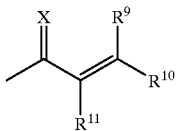

wherein $R^{9-11}$ is a hydrogen or $C_{1-100}$ alkyl or aryl or mixed alkyl or aryl group; X is an oxygen, and m ranges from 1–200.

Preferable capped poly(phenylene ether)s of the present invention include methacrylate capped polyphenylene ethers produced by reacting a poly(phenylene ether) with, for example, methacrylic anhydride in the presence of a capping catalyst. Even relatively low levels of residual phenolic hydroxyl groups may severely inhibit the free-radical cure reaction and depress the glass transition temperature of the fully cured resin composition. It is preferred that the PPE be converted to the CMPPE product with more than 98%, or more preferably 99%, or most preferably substantially 100% conversion of the free hydroxyl groups to capped species. It is readily understood by those skilled in the art that at substantially 100% conversion there is substantially no residual phenolic hydroxyls remaining after the chemical modification. In an especially preferred embodiment, the present invention includes a methacrylate capped polyphenylene ether resin having an intrinsic viscosity between about 0.08 and 0.14 dl/g as measured in chloroform at 30° C. wherein substantially 100% of the free hydroxyl groups on the polyphenylene ether resin have been capped.

In addition to the aforementioned components, curing catalysts for the unsaturated components also may be included. The curing agent for the unsaturated portion of the thermosetting composition includes any compound capable of producing radicals at elevated temperatures. Such curing catalysts include both peroxy and non-peroxy based radical initiators. Examples of peroxy initiators useful in the present invention include, for example, 2,5-dimethylhexane-2,5-dihydroperoxide, 2,5-dimethyl-2,5-di(t-butylperoxy)-hex-3-yne, di-t-butylperoxide, t-butylcumyl peroxide, t-butyl peroctoate, α,α'-bis(t-butylperoxy-m-isopropyl)benzene, 2,5-dimethyl-2,5-di(t-butylperoxy)hexane, dicumylperoxide, di(t-butylperoxy isophthalate, t-butylperoxybenzoate, 2,2-bis(t-butylperoxy)butane, 2,2-bis(t-butylperoxy)octane, 2,5-dimethyl-2,5-di(benzoylperoxy)hexane, di(trimethylsilyl)peroxide, and trimethylsilylphenyltriphenylsilyl peroxide and the like. Typical non-peroxy initiators include compounds such as, for example, 2,3-dimethyl-2,3-diphenylbutane, 2,3-trimethylsilyloxy-2,3-diphenylbutane, and the like.

The aforementioned formulations also may be cured using irradiation techniques and would contain the aforementioned catalysts or those for such electron beam curing. Typical examples are electron beam and UV radiation.

A preferred embodiment of this invention is a glass-fiber reinforced, copper-clad electrical laminate. The glass reinforcement of such an embodiment can be in one of many suitable forms. Some of the forms include, e.g., chopped fibers, wet laid chopped fibers, continuous fibers, wet-laid continuous fibers, woven fabrics, air-laid mats and the like. A preferred form of reinforcement is a woven glass fabric of less than 6 oz per sq. yard, or more preferably less than 4.5 oz per sq. yard, or most preferably less than 3.5 ounces per square yard. In a preferred embodiment, a plurality of such woven fabric is utilized to provide the target laminate thickness.

The composition of the glass fiber can vary according to those well known in the art. Specific examples include e-glass, ne-glass, and quartz glass compositions. In a preferred embodiment e-glass is preferred.

Alternately, organic fibers can be used to provide reinforcement in form analogous in weights to those listed above. Such organic fibers include, e.g., aramid, ultrahigh-molecular weight polyethylene, polypropylene and the like. The aramid fiber reinforcements, such as Thermount® from DuPont are available as a wet-laid continuous filament nonwoven. In a preferred embodiment with organic fibers, aramid fibers are utilized.

All patents cited are incorporated herein by reference.

The invention will be further illustrated by the following examples.

EXPERIMENTAL

All compositions recited in the examples were prepared by the following method:

1) The EUAM component(s) were added to a mixing vessel in the desired proportions.
2) The VTP resin and CMPPE component(s) and any other ingredients(s) were charged into a mixing vessel.
3) The ingredients were mixed with a Cowels blade on an air motor at moderate (about 1,000 rpm) speed for five minutes.
4) The initiator(s) (e.g., organic peroxides) were added to the composition while the air motor was operating at low speed (about 400 rpm) and mixed for about 5 minutes. The composition is now ready for use.

The general lamination method for preparing the electrical laminates is as follows:

1) A layer of plastic release film (such as Mylar® film from DuPont) of 1.42 mils thick was placed on an ¼ inch thick tempered glass plate of 1.00 by 1.00 feet. The dimensions of the film were large enough to protrude around the edges of the glass plate.
2) A one foot square piece of one ounce per square foot copper foil was placed treatment side up on the film.
3) A film of the inventive resin composition, prepared according to the to the present invention, was metered onto the copper foil by using 22 mil gauges and a wire-wound rod designed to provide a coating of the target thickness of the laminate. Wire-wound rods are well known throughout the coatings industry.
4) A layer of glass cloth, woven or non-woven, was laid onto the resin film and allowed to saturate for approximately 2 minutes. If a plurality of layers were used, the layers were placed onto the resin film approximately 2 minutes apart to allow the resin mixture to saturate the glass.
5) An additional layer of copper foil, of the same size and weight as described in step 2, was placed treatment side down on the laminate so as to align the edges with the first sheet of copper foil. This foil must be rolled on with a precisely milled bar to avoid porosity. See step 6 below.
6) A four inch diameter 16 inch long hollow steel cylinder (machined to provide uniform diameter and smooth finish) was placed at one edge of the laminate and gently rolled to the opposing edge while being forced by hand to ride on the gauges. As the cylinder moved across the laminate, the excess resin composition and entrained air bubbles were allowed to drain out of the laminate.
7) Another layer of release film, of the same size and dimensions as described in step 1 was placed on top of the copper foil.
8) Two ½ inch wide by 12 inches long shims of the approximate laminate thickness were placed on opposing sides of the laminate on top of the carrier film, but still on the glass plate.
9) Another plate of glass of equivalent dimensions as described in step 1, was placed on top of the laminate.
10) The glass-encased laminate was placed in a horizontal-opening press preheated to about 220° F. under about 10 psi for about 20 minutes.
11) The laminate was removed from the press and placed in a forced-air convection oven at about 350° F. for about one hour to post-cure.
12) After post-cure, the laminate is removed from the oven and allowed to cool to room temperature.

Examples 1–6 and Comparative Examples

The resin compositions of the weight percentages listed in Table 1 were prepared according to the aforementioned method. The resin composition was applied to multiple plies of woven E-type glass fabric of various styles chosen to achieve the target glass content, and 0.2 parts-per-hundred resin of t-butyl peroctoate (initiator) was employed to prepare an electrical laminate by the aforementioned lamination method.

In Table 1, the following abbreviations are used:

"PBDU" represents a vinyl-terminated polybutadiene resin containing a urethane residue;

"PBD" represents a vinyl-terminated polybutadiene resin such as RICON 100 from Ricon Resins Inc.;

"PBDE" represents a vinyl-terminated polybutadiene resin containing an ester residue;

"PPE1" represents the reaction product of a low molecular weight (0.12 intrinsic viscosity) polyphenylene ether resin with methacrylic anhydride;

"PPE2" represents a low molecular weight (0.12 intrinsic viscosity) polyphenylene ether resin without chemical modification;

"PPE3" represents the reaction product of a low molecular weight (0.12 intrinsic viscosity) polyphenylene ether resin with isobutyric anhydride;

"Silica" represents fused silica powder

The following notes also apply to the data in Table 1.

Peel Bond is measured on 1 oz/ft$^2$ copper foil by test method IPC-TM-650 (Units=lbs/inch width) where AR=as-received and AS=after-solder immersion at 550° F. for 20 seconds Tg represents glass transition temperature as measured by dynamic mechanical analysis at a heating rate of 20° C./min under nitrogen (Perkin Elmer DMA7E) (Units=degrees Celsius)

Dk=dielectric constant and Df=dissipation factor as measured by Model 0501 Thin Sheet Tester from Damaskos, Inc. at 2.12 GHz frequency Dielectric thickness is in mils Solder stability is dwell time in seconds at 550° F. before blistering or delamination "Cure" represents if material cured (as evident by not being a liquid) during step 11 and 12 above

TABLE 1

| | Comparative examples | | | | Examples of Invention | | | | | |
|---|---|---|---|---|---|---|---|---|---|---|
| | A | B | C | D | 1 | 2 | 3 | 4 | 5 | 6 |
| PBDU | | 3.97 | 3.97 | | 6.0 | 2.0 | 1.0 | 0.85 | 0.85 | 4.50 |
| PBD | | | | 6.0 | | | | | | |
| PPE1 | 29.83 | | | 26.94 | 26.94 | 26.94 | 30.5 | 21.35 | 21.35 | 22.65 |
| PPE2 | | 30.0 | | | | | | | | |
| PPE3 | | | 30.0 | | | | | | | |
| Styrene | 32.17 | 30.0 | 30.0 | 29.06 | 29.06 | 29.06 | 30.5 | 25.69 | 25.69 | 27.25 |
| Divinyl Benzene | | 2.03 | 2.03 | | | | 5.0 | 4.24 | 4.24 | |
| Dibromo-styrene | 38.0 | 34.01 | 34.01 | 38.0 | 38.0 | 42.0 | 33.0 | 32.71 | 32.71 | 34.70 |
| Silica | | | | | | | | 15.0 | 15.0 | |
| Boron Nitride | | | | | | | | | | 10.0 |
| % Glass | 17.2 | 17.58 | 17.58 | 17.15 | 17.26 | 16.89 | 15.17 | 21.08 | 15.17 | 16.85 |
| Properties: | | | | | | | | | | |
| Cure | Yes | No | Yes | Yes | Yes | Yes | Yes | Yes | Yes | Yes |
| Peel Bond AR | 5.7 | N/A | 3.3 | 5.0 | 7.5 | 5.7 | 6.5 | 7.3 | 7.3 | 6.4 |
| Peel Bond AS | 5.7 | N/A | 3.5 | 5.4 | 6.7 | 6.5 | 5.9 | 7.4 | 7.4 | 6.6 |
| Dk | 2.931 | N/A | 2.90 | 2.961 | 2.829 | 2.787 | 2.859 | 3.052 | 2.94 | 2.92 |
| Df | .00193 | N/A | .0026 | .00214 | .00243 | .00215 | .00216 | .00223 | .00208 | .00188 |
| Tg (° C.) | 167 | N/A | 142 | 152 | 164 | 161 | 167 | 156 | 166 | 167 |
| Dielectric Thickness | .060 | N/A | .060 | 0.60 | .060 | .060 | .060 | .060 | .060 | .060 |
| Solder Stability | >120 | N/A | 54 | 55 | >120 | >120 | >120 | >120 | >120 | >60 |

Analysis of the controls demonstrates that unmodified PPE (PPE2) that contains hydroxyl groups hinders the curing of the composition, e.g., Comparative Example B did not cure and Comparative Examples A and C, each containing a CMPPE did cure. These results exemplify the importance of modifying the PPE to reduce the number of hydroxyl moieties in order to achieve a desired cure.

Comparison of the property data for Comparative example D to the property data of Example 1 highlights to unexpected increase in adhesion obtained using vinyl terminated polymers having ester or urethane functionality. For examples, Comparative example D using a vinyl terminated polybutadiene resin without the additional functional residue had Peel Bonds of 5.0 and 5.4 as received and after soldering respectively, whereas Example 1 having a vinyl terminated polybutadiene resin with additional urethane functional residue had Peel Bonds of 7.5 and 6.7 as received and after soldering, respectively. Moreover, the solder stability dramatically increased with the use of the vinyl terminated polybutadiene resin with additional functional residue. It is unexpected that this combination of desirable properties would be obtained with the illustrative examples of the invention. One of skill in this art recognizes the superior combination of properties obtained with the present invention.

What is claimed is:

1. A thermosetting resin composition comprising:

(a) at least 50% by weight of one or more ethylenically unsaturated aromatic monomers having the formula:

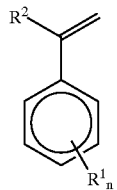

wherein $R^1$ represents a hydrogen, an alkene group, or alkyl group, and n=1, or wherein $R^1$ represents halogen atoms n=1 to 3, and $R^2$ represents a hydrogen atom or an alkyl group, and;

(b) from 1 to 50% by weight of a vinyl-terminated polymer having the formula:

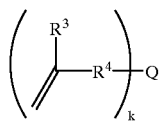

wherein $R^3$ represents $CH_3$ or H, $R^4$ is an urethane or ester residue, and Q represents a polybutadiene homopolymer or a butadiene-styrene copolymer, and k is on average less than 3, and;

(c) from 1 to 50% of a chemically modified polyphenylene ether resin comprising aliphatic unsaturation; wherein all weight percentages are based on the combined weights of components (a), (b), and (c).

2. The composition of claim 1, wherein said ethylenically unsaturated monomer is selected from the group consisting of dibromostyrene, styrene, divinyl benzene, α-methyl styrene, and mixtures comprising at least one of the foregoing.

3. The composition of claim 1, which further comprises an initiator.

4. The composition of claim 3, wherein said initiator is selected from the group consisting of t-butyl peroctoate, t-butyl peroxy benzoate, and dicumyl peroxide.

5. The composition of claim 1, wherein said vinyl-terminated polybutadiene homopolymer containing a urethane group is the reaction product of a polybutadiene polyol with a vinyl terminated isocyanate.

6. The composition of claim 1, wherein said vinyl-terminated polybutadiene homopolymer containing an ester group is the reaction product of a carboxyl-terminated polybutadiene homopolymer with a vinyl-terminated epoxide.

7. The composition of claim 1, wherein said vinyl-terminated butadiene-styrene copolymer containing an ester group is the reaction product of a carboxyl-terminated butadiene-styrene copoylmer with a vinyl-terminated epoxide.

8. The composition of claim 1, wherein said chemically modified polyphenylene ether resin has an intrinsic viscosity between about 0.08 and 0.14 dl/g as measured in chloroform at 30° C.

9. The composition of claim 1, wherein said chemically modified polyphenylene ether resin comprises a chemically modified polyphenylene ether resin of the formula:

Q—(J—K)m wherein Q is the residuum of a phenol;
J comprises recurring units of the following structure:

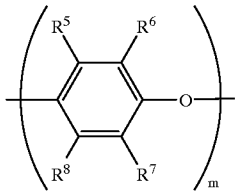

wherein $R^{5-8}$ independently is selected from hydrogen, alkyl, alkenyl, alkynoyl, aryl, mixed alkyl-aryl hydrocarbons, wherein such groups may contain a substituent selected from carboxylic acid, aldehyde, alcohol, and amino functionality;

K has the following structure:

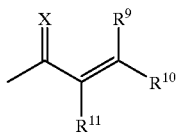

wherein $R^{9-11}$ is a hydrogen or $C_{1-100}$ alkyl or aryl or mixed alkyl or aryl group; X is an oxygen, and m ranges from 1–200.

10. The composition of claim 1, wherein said chemically modified polyphenylene ether resin comprises residual methacrylate moieties.

11. The composition of claim 1, wherein said chemically modified polyphenylene ether resin comprises a chemically modified polyphenylene ether resin having the formula:

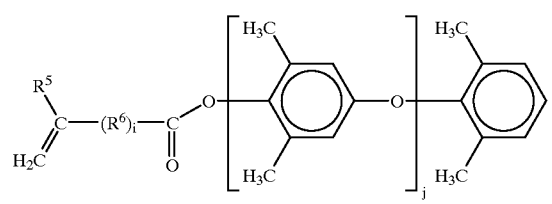

wherein $R^5$ represents $CH_3$ or H, $R^6$ represents an alkylidene group, and i=1 to 6, and j<30.

12. The composition of claim 1, wherein said chemically modified polyphenylene ether resin comprises substantially no residual phenolic hydroxyls.

13. The composition of claim 1, wherein vinyl-terminated polymer comprises:

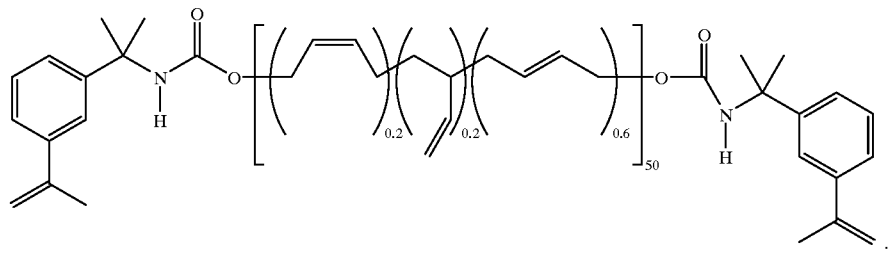

14. The composition of claim 1, where in vinyl-terminated polymer comprises:

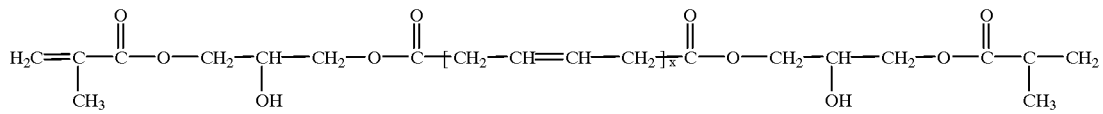

wherein x is from about 50 to 250.

15. A reaction product of a composition comprising:

(a) at least 50% by weight of one or more ethylenically unsaturated aromatic monomers having the formula:

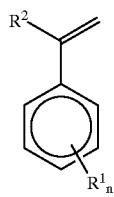

where $R^1$ represents a hydrogen, an alkene group or alkyl groups and n=1, or where $R^1$ represents halogen atoms n=1 to 3, and $R^2$ represents a hydrogen atom or an alkyl group, and;

(b) from 1 to 50% by weight of a vinyl-terminated polymer having the formula:

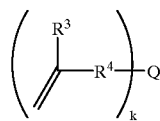

where $R^3$ represents $CH_3$ or H, $R^4$ is an urethane or ester residue, and Q represents a polybutadiene homopolymer or a butadiene-styrene copolymer, and k is on average less than 3, and;

(c) from 1 to 50% of a chemically modified polyphenylene ether resin comprising aliphatic unsaturation;

wherein all weight percentages are based on the combined weights of components (a), (b), and (c).

16. The reaction product of claim 15, wherein said chemically modified polyphenylene ether resin has an intrinsic viscosity between about 0.08 and 0.14 dl/g as measured in chloroform at 30° C.

17. The reaction product of claim 15, wherein said chemically modified polyphenylene ether resin comprises residual methacrylate moieties.

18. The reaction product of claim 15, wherein said chemically modified polyphenylene ether resin comprises substantially no residual phenolic hydroxyls.

19. The reaction product of claim 15, wherein said vinyl-terminated polymer comprises:

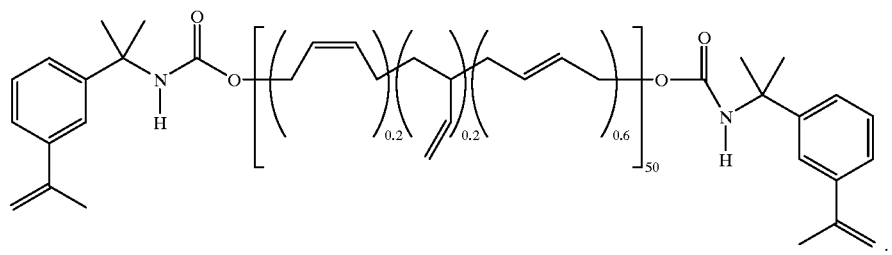

20. The reaction product of claim 15, wherein said vinyl-terminated polymer comprises:

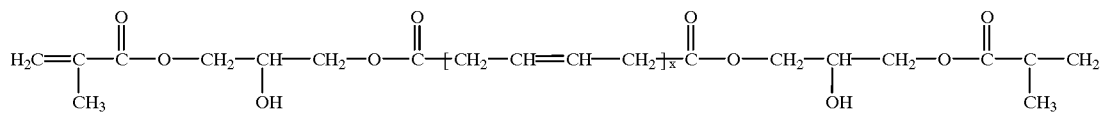

wherein x is from about 50 to 250.

21. A laminate comprising:
(i) a reaction product of a composition comprising:
(a) from 20 to 90% by weight of one or more ethylenically unsaturated aromatic monomers having the formula:

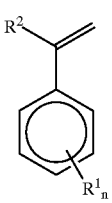

where $R^1$ represents a hydrogen, an alkene group or alkyl groups and n=1, or where $R^1$ represents halogen atoms n=1 to 3, and $R^2$ represents a hydrogen atom or an alkyl group;

(b) from 1 to 50% by weight of a vinyl-terminated polymer having the formula:

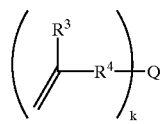

where $R^3$ represents $CH_3$ or H, $R^4$ is an urethane or ester residue, and Q represents a polybutadiene homopolymer or a butadiene-styrene copolymer; and k is on average less than 3, and (c) from 1 to 50% by weight of a chemically modified polyphenylene ether resin comprising aliphatic unsaturation; wherein the weight percentages of components (a), (b), and (c) are based on the combined weights of components (a), (b), and (c);

(ii) from 5 to 60% by weight of a woven fabric based on the combined weights of components (i) and (ii).

22. The laminate of claim 21, wherein said chemically modified polyphenylene ether resin has an intrinsic viscosity between about 0.08 and 0.14 dl/g as measured in chloroform at 30° C.

23. The laminate of claim 21, wherein said composition further comprises an initiator.

24. The laminate of claim 22, wherein said initiator wherein said initiator is selected from the group consisting of t-butyl peroctoate, t-butyl peroxy benzoate, and dicumyl peroxide.

25. The laminate of claim 21, wherein said ethylenically unsaturated aromatic monomer is selected from the group consisting of styrene, dibromostyrene, divinyl benzene, α-methyl styrene, and mixtures comprising at least one of the foregoing.

26. The laminate of claim 21, wherein said laminate is clad with metal foil on one or both sides.

27. The laminate of claim 26, wherein said metal foil is copper foil.

28. The laminate of claim 21, wherein said laminate has a thickness between about 0.002 to about 0.120 inches.

29. The laminate of claim 21, wherein said laminate has a dissipation factor of less than about 0.004 at 10 GHz.

30. The laminate of claim 21, wherein said laminate comprises a microwave circuit substrate.

31. The laminate of claim 21, wherein said vinyl-terminated polymer comprises:

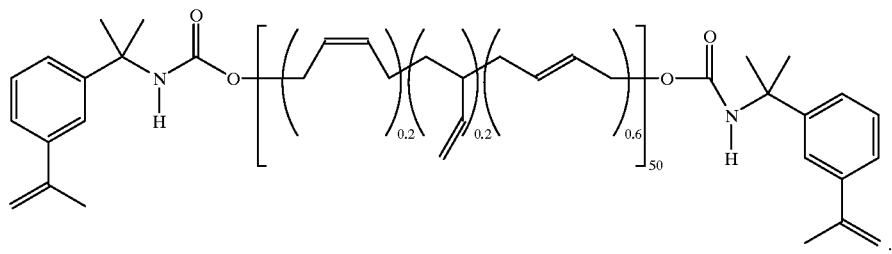

32. The laminate of claim 21, wherein said vinyl-terminated polymer comprises:

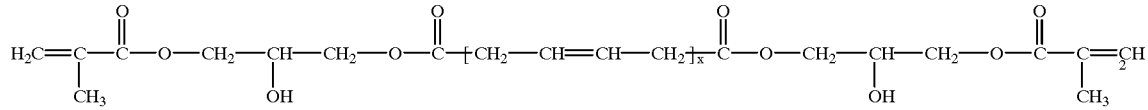

wherein x is from about 50 to 250.

33. A laminate comprising:
(i) a reaction product of a composition comprising:
(a) from 20 to 90% by weight of one or more ethylenically unsaturated aromatic monomers having the formula:

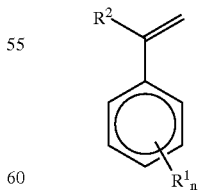

where $R^1$ represents a hydrogen, an alkene group or alkyl groups and n=1, or where $R^1$ represents halogen atoms n=1 to 3, and $R^2$ represents a hydrogen atom or an alkyl group;

(b) from 1 to 50% by weight of a vinyl-terminated polymer having the formula:

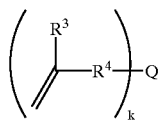

where $R^3$ represents $CH_3$ or H, $R^4$ is an urethane or ester residue, and Q represents a polybutadiene homopolymer or a butadiene-styrene copolymer; and k is on average less than 3, and (c) from 1 to 50% by weight of a chemically modified polyphenylene ether resin comprising aliphatic unsaturation; wherein the weight percentages of components (a), (b), and (c) are based on the combined weights of components (a), (b), and (ii) from 5 to 60% by weight of a woven fabric and from 1 to 25% by weight of one or more inorganic fillers, based on the combined weights of components (i) and (ii).

34. The laminate of claim 33, wherein said chemically modified polyphenylene ether resin has an intrinsic viscosity between about 0.08 and 0.14 dl/g as measured in chloroform at 30° C.

35. The laminate of claim 33, wherein said chemically modified polyphenylene ether resin comprises residual methacrylate moieties.

36. The laminate of claim 33, wherein said chemically modified polyphenylene ether resin comprises substantially no residual phenolic hydroxyls.

37. The laminate of claim 33, wherein said composition further comprises an initiator.

38. The laminate of claim 37, wherein said initiator wherein said initiator is selected from the group consisting of t-butyl peroctoate, t-butyl peroxy benzoate, and dicumyl peroxide.

39. The laminate of claim 33, wherein said ethylenically unsaturated aromatic monomer is selected from the group consisting of styrene, dibromostyrene, divinyl benzene, α-methyl styrene, and mixtures comprising at least one of the foregoing.

40. The laminate of claim 33, wherein said laminate is clad with metal foil on one or both sides.

41. The laminate of claim 40, wherein said metal foil is copper foil.

42. The laminate of claim 33, wherein said laminate has a thickness between about 0.002 to about 0.120 inches.

43. The laminate of claim 33, wherein said laminate has a dissipation factor of less than about 0.004 at 10 GHz.

44. The laminate of claim 33, wherein said laminate comprises a microwave circuit substrate.

45. The laminate of claim 33, wherein said inorganic filler is selected form the group consisting of silica, quartz, wollostonite, alumina, boron nitride, magnesium aluminum silicate, kaolin, calcined kaolin, and mixture containing at least one of the foregoing.

46. The laminate of claim 33, wherein said vinyl-terminated polymer comprises:

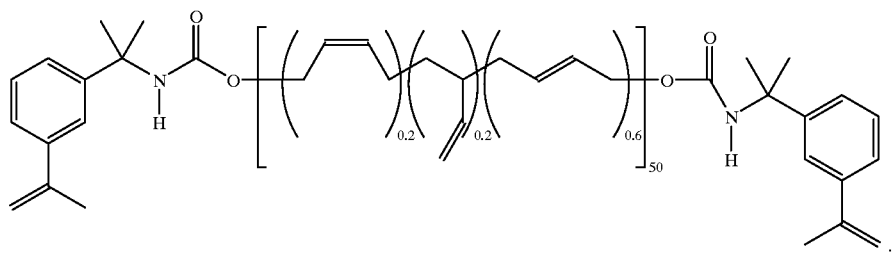

47. The laminate of claim 33, wherein said vinyl-terminated polymer comprises:

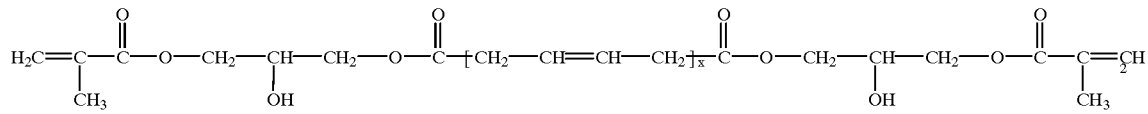

wherein x is from about 50 to 250.

48. A thermosetting resin composition comprising:
about 1 to 99% by weight of one or more ethylenically unsaturated aromatic monomers having the formula:

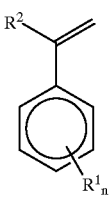

wherein $R^1$ represents a hydrogen, an alkene group, or alkyl group, and n=1, or wherein $R^1$ represents halogen atoms n=1 to 3, and $R^2$ represents a hydrogen atom or an alkyl group, and;

(b) from 1 to 99% by weight of a vinyl-terminated polymer having the formula:

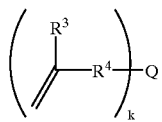

wherein $R^3$ represents $CH_3$ or H, $R^4$ is an urethane or ester residue, and Q represents a polybutadiene homopolymer or a butadiene-styrene copolymer, and k is on average less than 3, and;

(c) from 1 to 99% of a chemically modified polyphenylene ether resin comprising aliphatic unsaturation; wherein all weight percentages are based on the combined weights of components (a), (b), and (c).

49. The composition of claim 48, which further comprises an initiator.

50. The composition of claim 48, which further comprises one or more fillers, reinforcing agents, or fillers and reinforcing agents.

51. A reaction product of a composition comprising:

(a) about 1 to 99% by weight of one or more ethylenically unsaturated aromatic monomers having the formula:

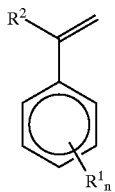

wherein $R^1$ represents a hydrogen, an alkene group, or alkyl group, and n=1, or wherein $R^1$ represents halogen atoms n=1 to 3, and $R^2$ represents a hydrogen atom or an alkyl group, and;

(b) from 1 to 99% by weight of a vinyl-terminated polymer having the formula:

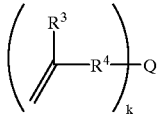

wherein $R^3$ represents $CH_3$ or H, $R^4$ is an urethane or ester residue, and Q represents a polybutadiene homopolymer or a butadiene-styrene copolymer, and k is on average less than 3, and;

(c) from 1 to 99% of a chemically modified polyphenylene ether resin comprising aliphatic unsaturation; wherein all weight percentages are based on the combined weights of components (a), (b), and (c).

* * * * *